(12) United States Patent
Sasaki

(10) Patent No.: US 9,362,373 B2
(45) Date of Patent: Jun. 7, 2016

(54) SEMICONDUCTOR DEVICE AND THE METHOD OF MANUFACTURING THE SAME

(71) Applicant: FUJI ELECTRIC CO., LTD., Kawasaki-shi (JP)

(72) Inventor: Koji Sasaki, Matsumoto (JP)

(73) Assignee: FUJI ELECTRIC CO., LTD., Kawasaki-shi (JP)

( * ) Notice: Subject to any disclaimer, the term of this patent is extended or adjusted under 35 U.S.C. 154(b) by 0 days.

(21) Appl. No.: 13/661,105

(22) Filed: Oct. 26, 2012

(65) Prior Publication Data

US 2013/0105856 A1 May 2, 2013

(30) Foreign Application Priority Data

Oct. 28, 2011 (JP) ................. 2011-236849

(51) Int. Cl.

| | |
|---|---|
| H01L 29/732 | (2006.01) |
| H01L 29/417 | (2006.01) |
| H01L 23/48 | (2006.01) |
| H01L 29/66 | (2006.01) |
| H01L 29/739 | (2006.01) |
| H01L 29/06 | (2006.01) |

(52) U.S. Cl.
CPC ........ *H01L 29/41708* (2013.01); *H01L 23/481* (2013.01); *H01L 29/0696* (2013.01); *H01L 29/66348* (2013.01); *H01L 29/7397* (2013.01)

(58) Field of Classification Search
CPC ............... H01L 21/76804; H01L 21/76816; H01L 21/76802; H01L 21/76807
USPC .................... 257/330–332, 774; 438/640, 688
See application file for complete search history.

(56) References Cited

U.S. PATENT DOCUMENTS

| | | | | |
|---|---|---|---|---|
| 6,211,071 B1 * | 4/2001 | Lukanc et al. | ................ | 438/640 |
| 6,391,770 B2 * | 5/2002 | Kosaki et al. | ................ | 438/650 |
| 6,649,973 B2 * | 11/2003 | Takaishi | ................ | 257/328 |

(Continued)

FOREIGN PATENT DOCUMENTS

| | | |
|---|---|---|
| JP | 11040514 A | 2/1999 |
| JP | 2003109970 A | 4/2003 |

(Continued)

OTHER PUBLICATIONS

Japanese Office Action issued in Japanese counterpart application No. JP2011-236849, dated Aug. 11, 2015. English translation provided.

*Primary Examiner* — Bryan Junge
(74) *Attorney, Agent, or Firm* — Rossi, Kimms & McDowell LLP

(57) ABSTRACT

A semiconductor device includes a semiconductor substrate which functions as an $n^-$ drift layer, a trench IGBT formed in the front surface, an interlayer insulator film, and a metal electrode layer on the interlayer insulator film. There is a contact hole in the interlayer insulating film which has a first opening formed on the metal electrode layer side and a second opening on the semiconductor substrate side. Width w1 of the first opening on the metal electrode layer side is wider than width w2 of first opening on the semiconductor substrate side, in a direction perpendicular to the extending direction of the trench in the planar pattern of trenches. The metal electrode layer is connected to a p-type channel region and an $n^+$ source region via the contact hole. The method of manufacturing improves the reliability of the device.

15 Claims, 15 Drawing Sheets

(56) References Cited

U.S. PATENT DOCUMENTS

| | | | |
|---|---|---|---|
| 7,456,097 B1 * | 11/2008 | Hill | H01L 21/76804 257/E21.577 |
| 7,977,165 B2 * | 7/2011 | Okuda et al. | 438/138 |
| 8,227,323 B2 | 7/2012 | Takahashi et al. | |
| 2005/0181618 A1 * | 8/2005 | Wang | H01L 21/31138 438/725 |
| 2009/0065941 A1 * | 3/2009 | La Tulipe, Jr. | H01L 21/76802 257/761 |

FOREIGN PATENT DOCUMENTS

| | | |
|---|---|---|
| JP | 2003-152075 A | 5/2003 |
| JP | 2007149867 A | 6/2007 |
| JP | 2010129585 A | 6/2010 |
| JP | 2011003726 A | 1/2011 |

* cited by examiner

SEMICONDUCTOR DEVICE AND THE METHOD OF MANUFACTURING THE SAME

BACKGROUND OF THE INVENTION

A. Field of the Invention

The present invention relates to semiconductor devices and the method of manufacturing the semiconductor devices.

B. Description of the Related Art

As one of the insulated-gate semiconductor devices, an insulated-gate bipolar transistor (hereinafter referred to as an "IGBT") that employs a trench-gate structure for the front surface device structure is well known to the persons skilled in the art. Now the manufacturing method for manufacturing an IGBT having a conventional trench-gate structure (hereinafter referred to as a "trench IGBT") will be described below exemplary in connection with a trench IGBT including metal electrodes on both semiconductor substrate surfaces.

FIGS. 11 and 12 are the cross sectional views of a conventional semiconductor device on the way of manufacture thereof. In FIGS. 11 and 12, the active region of the trench-gate IGBT is shown, but the breakdown-withstanding structure surrounding the active region is not. (In FIG. 1, FIGS. 4 through 9, and FIGS. 13 through 15, only the active region is shown similarly). The active region is a region through which a current flows in the ON-state of the semiconductor device. The breakdown-withstanding structure is a structure that relaxes the electric field strength in the pn-junction plane and realizes a desired breakdown voltage.

As shown in FIG. 11, the front surface device structure, including gate electrode 2, gate insulator film 3, channel region 4, and source region 5, is formed through the general manufacturing process in the front surface of the active region in the semiconductor substrate that works as drift region 1. Simultaneously with forming the front surface device structure of the trench IGBT in the active region, the front surface device structure (not shown) of the breakdown-withstanding structure is formed such that the breakdown-withstanding structure surrounds the active region. Interlayer insulator film 107 is formed on the front surface of the semiconductor substrate by the chemical vapor deposition method (hereinafter referred to as the "CVD" method).

Contact hole 111 is formed through interlayer insulator film 107 by photolithography. Channel region 4, in which source region 5 is formed, and a part of source region 5 formed in channel region 4 are exposed to contact hole 111. Contact hole 111 is an opening, through which the metal electrode layer formed on the front surface of the semiconductor substrate is connected to channel region 4 and source region 5 in the late step.

Then, metal electrode layer 108 made of aluminum (Al) and such a metal is deposited on interlayer insulator film 107 by sputtering as shown in FIG. 12. By the deposition, metal electrode layer 108 is buried in contact hole 111 and connected to channel region 4 and source region 5 through contact hole 111. Metal electrode layer 108 is patterned by photolithography and annealed thermally to provide metal electrode layer 108 with stable adhesiveness and excellent electrical performances.

A passivation film (not shown) is formed on the front surface of the semiconductor substrate. The passivation film is patterned by photolithography to expose metal electrode layer 108. A pretreatment and a zincate treatment are conducted to form a metal plating layer on metal electrode layer 108. After the treatments, a metal plating layer (not shown) is formed on metal electrode layer 108 by electroless plating. A not-shown collector region and a not-shown back surface electrode are formed on the back surface of the semiconductor substrate. Thus, a vertical trench IGBT is completed.

In the proposed method for manufacturing a semiconductor device including a metal electrode layer on the front surface of a semiconductor substrate, a pattern is formed through a resist in the oxide film deposited on the semiconductor substrate. Then, the oxide film is etched by isotropic dry etching for half the thickness thereof. Further, a contact hole is formed by anisotropic dry etching such that the contact hole reaches semiconductor substrate. Aluminum is deposited on the contact hole to form an aluminum electrode. Further, an overcoat film is formed on the aluminum electrode (cf. Japanese Unexamined Patent Application publication No. 2003-152075).

The concentrated studies conducted by the present inventor have revealed that problems as described below are caused by the conventional techniques.

FIGS. 13 through 15 are third through fifth cross sectional views of the conventional semiconductor device on the way of manufacture thereof. FIGS. 13 through 15 show the cross sectional structures of the semiconductor device in the manufacturing process subsequent to FIG. 12. According to the conventional method for manufacturing a semiconductor device, a step as high as the interlayer insulator film 107 thickness is caused between interlayer insulator film 107 and the semiconductor substrate exposed to contact hole 111.

When interlayer insulator film 107 is thick, e.g., 0.5 μm or thicker, the step caused between interlayer insulator film 107 and the semiconductor substrate exposed to contact hole 111 is high, impairing the step coverage of interlayer insulator film 107. If the step coverage of interlayer insulator film 107 is impaired, the growth of metal electrode layer 108 by sputtering on the side wall of contact hole 111 will be delayed. Due to the delayed growth, void 112 is caused locally in metal electrode layer 108. Void 112 is a concavity caused in the metal electrode layer 108 surface or a cavity caused in metal electrode layer 108. In FIG. 12, a concavity caused in the surface of metal electrode layer 108 is shown.

When void 112 is caused on metal electrode layer 108, the resist mask used for patterning metal electrode layer 108 gets into void 112. The resist that has gotten into void 112 cannot be removed by an ashing treatment. Therefore, organic residue 113 remains in void 112 as shown in FIG. 13. Residue 113 remaining in void 112 is carbonized by the thermal annealing treatment conducted after forming the pattern of metal electrode layer 108. Carbonized residue 114 sticks to the metal electrode layer 108 surface around void 112 as shown in FIG. 14.

The residue of the passivation film formed on the metal electrode layer 108 surface after forming the pattern of metal electrode layer 108 also remains on the metal electrode layer 108 surface in the same manner as resist residue 114. When residue 114 remains on the metal electrode layer 108 surface as described above, metal plating layer 109 is not formed on the portion of the metal electrode layer 108 surface, to which residue 114 is sticking as shown in FIG. 15. Therefore, in bonding metal plating layer 109 and a wire (not shown) to each other with a solder, the solder extends to the portion of metal electrode layer 108 not covered by metal plating layer 109, and the semiconductor device may break down.

In bonding metal electrode layer 108 and a wire to each other with a solder (although not illustrated) without forming metal plating layer 109, organic residue 114 remaining on the metal electrode layer 108 surface impairs the electric characteristics. For example, organic residue 114 remaining on the metal electrode layer 108 surface lowers the bonding strength between metal electrode layer 108 and the wire. As countermeasures, residue 114 may be prevented from occurring by improving the step coverage of metal electrode layer 108 to prevent void 112 from occurring. In this case however, other problems as described below will be caused.

To improve the step coverage of metal electrode layer 108 enough to prevent void 112 from occurring, metal electrode layer 108 may be deposited on the front surface of the semiconductor substrate by sputtering in a state in which the temperature of the semiconductor substrate is raised. However, when metal electrode layer 108 made of aluminum or a similar metal is formed on the semiconductor substrate surface without interposing any barrier film therebetween, the semiconductor substrate and metal electrode layer 108 will directly contact each other.

If the semiconductor substrate temperature is raised, an alloy spike will be caused in the semiconductor substrate, or silicon will segregate to the boundary between the semiconductor substrate and metal electrode layer 108, increasing the contact resistance. To prevent the increase in contact resistance caused by the alloy spike or the silicon segregation from occurring, it is impossible to raise the semiconductor substrate temperature to 400° C. or higher, because reflow of metal electrode layer 108 can be expected. The problem described above is caused also in the case, in which a void is caused in metal electrode layer 108. The reason for this is as follows. For example, if the surface portion of metal electrode layer 108 is removed by the pretreatment for plating metal plating layer 109 on the metal electrode layer 108 surface, the void inside metal electrode layer 108 will come out to the metal electrode layer 108 surface.

Japanese Unexamined Patent Application publication No. 2003-152075 proposes a method for improving the step coverage of the metal electrode layer. However, this document discloses nothing on the relation between the shape of the contact hole and the interlayer insulator film thickness. Since there is no description of the void caused in the metal electrode layer, the problems described above will be caused if the void occurs in the metal electrode layer.

In view of the foregoing, it would be desirable to obviate the problems described above. It would be also desirable to provide a semiconductor device, the reliability thereof is high. It would be further desirable to provide a method of manufacturing a semiconductor device, the reliability thereof is high. The present invention is directed to overcoming or at least reducing the effects of one or more of the problems set forth above.

SUMMARY OF THE INVENTION

According to an aspect of the invention, there is provided a semiconductor device including:
a semiconductor substrate of a first conductivity type working as a first semiconductor region of the first conductivity type;
a second semiconductor region of a second conductivity type formed in the surface portion on the front surface side of the semiconductor substrate;
a trench formed through the second semiconductor region into the first semiconductor region, the trenches extending in parallel to each other in the planar pattern thereof;
a first electrode in the trench with a gate insulator film interposed therebetween;
an interlayer insulator film on the opposite surface of the second semiconductor region opposite to the other surface of the second semiconductor region, through which the second semiconductor region is in contact with the first semiconductor region;
a second electrode on the interlayer insulator film, the second electrode being connected to the second semiconductor region via a contact hole formed in the interlayer insulator film;
the contact hole including a first opening and a second opening connected to the first opening on the side of the semiconductor substrate;
the first opening width of the first opening perpendicular to the extending direction of the trenches and on the side of the boundary between the interlayer insulator film and the second electrode being wider than the second opening width of the first opening perpendicular to the extending direction of the trenches and on the side of the semiconductor substrate;
the width of the second opening perpendicular to the extending direction of the trenches and on the side of the semiconductor substrate being equal to the second opening width of the first opening;
and
the thickness of the interlayer insulator film being 0.28 times or less as large as the first opening width of the first opening.

In a preferred embodiment, the thickness of the interlayer insulator film is 0.6 times or more as large as the second opening width of the first opening. Preferably, the contact hole is rectangular in the planar pattern thereof, and the contact holes are arranged in parallel and perpendicular to the extending direction of the trenches.

In a preferred embodiment, the contact holes parallel to each other in the direction perpendicular to the extending direction of the trenches are arranged along the extending direction of the trenches. Preferably, the second electrode is made of a material containing aluminum as the main component thereof, and preferably the second electrode is 2 µm or more in thickness. It is preferred that the interlayer insulator film be 0.5 µm or more in thickness. Advantageously, electroless plating is performed to the surface of the second electrode.

According to another aspect of the invention, there is provided a method of manufacturing a semiconductor device, the method including the steps of:
preparing a semiconductor substrate of a first conductivity type working as a first semiconductor region of the first conductivity type;
forming a second semiconductor region of a second conductivity type in the surface portion on the front surface side of the semiconductor substrate;
forming a trench through the second semiconductor region into the first semiconductor region, the trenches extending in parallel to each other in the planar pattern thereof;
burying a first electrode in the trench with a gate insulator film interposed therebetween;
forming an interlayer insulator film on the second semiconductor region;
forming a resist on the interlayer insulator film and forming an opening in the resist selectively;
conducting isotropic etching using the resist for a mask for forming a first opening in the interlayer insulator film, the first opening being shallower than the thickness of the interlayer insulator film;
conducting anisotropic etching for forming a second opening in the interlayer insulator film, the second opening being connected to the first opening, the second opening exposing the front surface of the semiconductor substrate; and the thickness of the interlayer insulator film being 0.28 times or less as large as the first opening width of the first opening in perpendicular to the extending direction of the trenches.

Advantageously, the method further includes steps of forming a second electrode on the interlayer insulator film and connecting the second electrode to the second semiconductor region through the first opening and the second opening.

In a preferred embodiment, the thickness of the interlayer insulator film is set to be 0.6 times or more as large as the second opening width of the first opening perpendicular to the extending direction of the trench. Advantageously, openings are formed in the resist in parallel and perpendicular to the extending direction of the trenches. Furthermore, it also is preferable to form a stripe-shaped opening in the resist extending in parallel to the extending direction of the trench.

Advantageously, the second electrode is made of a material containing aluminum as the main component thereof. Preferably, the second electrode is set to be 2 μm or more in thickness, and the interlayer insulator film is set to be 0.5 μm or more in thickness. Preferably, the method further includes a step of performing an electroless plating treatment for forming an electroless plating layer on the second electrode.

According to the invention, the step between the interlayer insulator film and the semiconductor substrate exposed to the contact hole is made to be gentle. Since the step coverage of the interlayer insulator film is improved due to the gentle step as compared with the step coverage of the interlayer insulator film according to the prior art, no void occurs in the metal electrode layer formed on the interlayer insulator film. Therefore, the resist mask for patterning the metal electrode layer is removed without leaving any residue of the resist on the metal electrode layer, and it is possible to form a metal plating layer uniformly on the metal electrode layer.

The semiconductor device according to the invention and the method of manufacturing a semiconductor device according to the invention improve the reliability of the semiconductor devices.

BRIEF DESCRIPTION OF THE DRAWINGS

The foregoing advantages and features of the invention will become apparent upon reference to the following detailed description and the accompanying drawings, of which.

DETAILED DESCRIPTION OF SPECIFIC EMBODIMENTS

Figure 1:
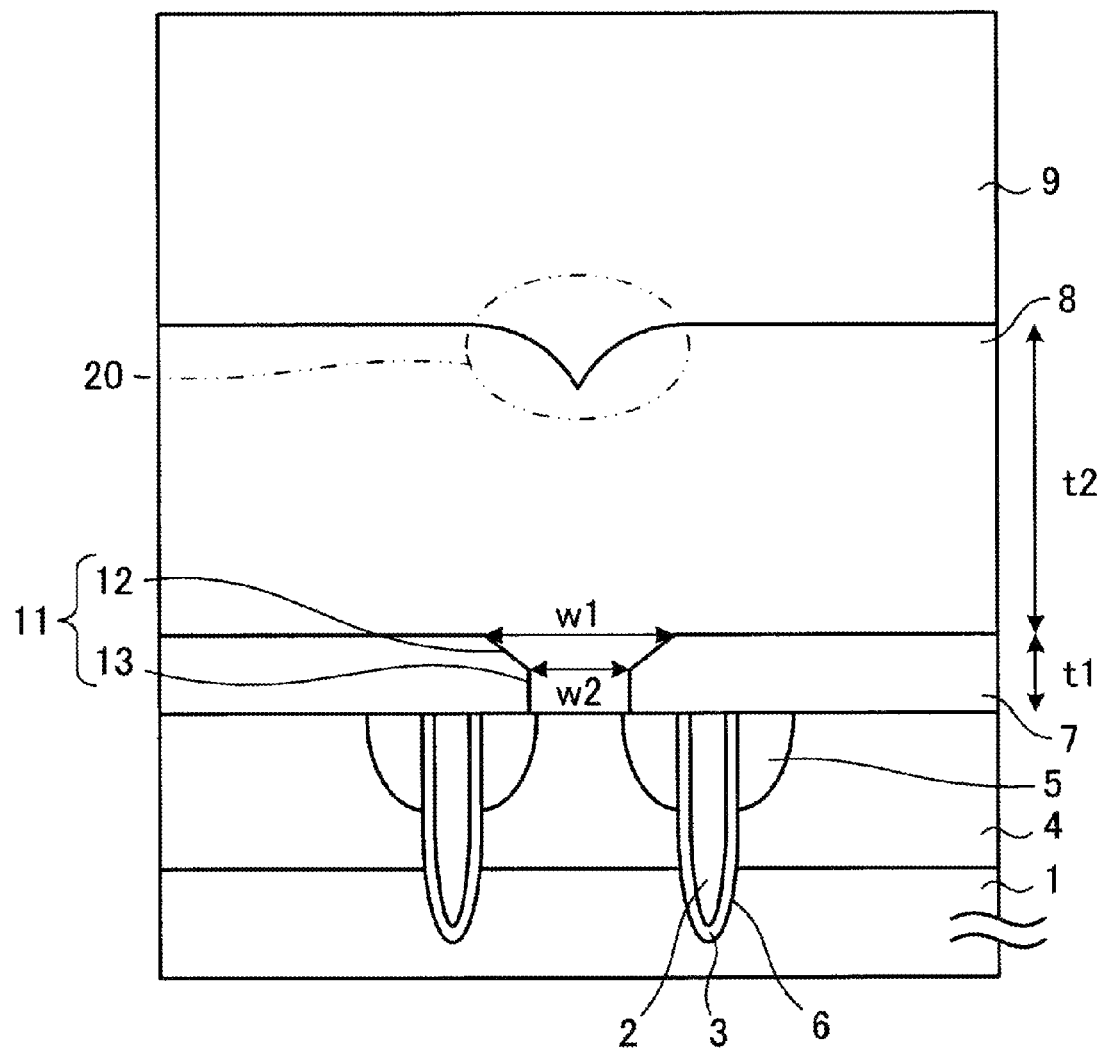
FIG. 1 is the cross sectional view of a semiconductor device according to a first embodiment of the invention.

Now the invention will be described in detail hereinafter with reference to the accompanied drawings which illustrate the preferred embodiments of the invention. In the following descriptions and the accompanied drawings, the n-type layer or the n-type region is a layer or a region in which electrons are majority carriers. The p-type layer or the p-type region is a layer or a region in which holes are majority carriers. The suffix "+" on the shoulder of the letter "n" or "p" indicating the conductivity type of the layer or the region indicates that the layer or the region is doped relatively heavily. The suffix "−" on the shoulder of the letter "n" or "p" indicating the conductivity type of the layer or the region indicates that the layer or the region is doped relatively lightly.

In the following descriptions and the accompanied drawings, the same reference numerals are used to designate the same or similar constituent elements and their duplicated descriptions will not be made for the sake of simplicity.

First Embodiment

FIG. 1 is the cross sectional view of a semiconductor device according to a first embodiment of the invention. The semiconductor device according to the first embodiment will be described in connection with a vertical trench IGBT as an example. As shown in FIG. 1, the semiconductor device according to the first embodiment includes a front surface device structure, including gate electrode 2, gate insulator film 3, p-type channel region (p-type base region: a second semiconductor region of a second conductivity type) 4, and $n^+$ source region 5, in the front surface of the active region in a semiconductor substrate of an n-type (first conductivity type) that works as $n^-$ drift region (a first semiconductor region of the first conductivity type) 1.

In detail, p-type channel region 4 is formed in the surface portion on the front surface side of the semiconductor substrate. Trench 6 is formed through p-type channel region 4 into $n^-$ drift region 1. Trenches 6 are shaped with the respective stripes extending in parallel to each other in the planar pattern thereof. Gate electrode (first electrode) 2 is buried in trench 6 with gate insulator film 3 interposed between gate electrode 2 and trench 6. $N^+$ source region 5 is formed selectively in the surface portion of p-type channel region 4.

$N^+$ source region 5 is in contact with gate insulator film 3 formed on the side wall of trench 6. Interlayer insulator film 7 is formed on the front surface of $n^-$ drift region 1 that is the surface opposite to the surface, through which p-type channel region 4 is in contact with $n^-$ drift region 1. Interlayer insulator film 7 may be an oxide film or a nitride film with no problem. The thickness t1 of interlayer insulator film 7 may be 0.5 µm or thicker, for example. Contact hole 11, e.g., for a source contact, may be formed in interlayer insulator film 7. Metal electrode layer (second electrode) 8 is formed on interlayer insulator film 7 and in contact hole 11.

Metal electrode layer 8 is connected to p-type channel region 4 and $n^+$ source region 5 via contact hole 11. Metal electrode layer 8 is made, for example, of a material containing aluminum as the main component thereof. In detail, metal electrode layer 8 may be made, for example, of aluminum or an aluminum alloy with no problem. The thickness t2 of metal electrode layer 8 may be 2 µm or thicker with no problem. Metal plating layer 9 is formed on metal plating layer 8. Metal plating layer 9 may be a plating layer made of nickel with no problem.

The breakdown withstanding structure (not shown) in the semiconductor substrate is formed such that the breakdown withstanding structure surrounds the active region. In the front surface of the breakdown withstanding structure, the front surface device structure of the breakdown withstanding structure such as a floating p-type semiconductor region (field limiting ring) and a field plate electrode in contact with the p-type semiconductor region is formed and a passivation film is formed on the front surface of the breakdown-withstanding structure.

Now the cross sectional shape of contact hole 11 will be described below. Contact hole 11 includes first opening 12 and second opening 13 connected to each other. First opening 12 is on the side of the boundary between interlayer insulator film 7 and metal electrode layer 8. The first opening width w1 on the side of the boundary between interlayer insulator film 7 and metal electrode layer 8 and perpendicular to the extending direction of trench 6 is wider than the second opening width w2 on the semiconductor substrate side and perpendicular to the extending direction of trench 6. Therefore, first opening 12 has a trapezoidal cross sectional shape, one of the parallel sides (bases) of which is on the side of the boundary between interlayer insulator film 7 and metal electrode layer 8 and the other one of the parallel sides is on the semiconductor substrate side.

Second opening 13 is connected to the semiconductor substrate side of first opening 12 and extended through interlayer insulator film 7 such that the front surface of the semiconductor substrate is exposed to second opening 13 selectively. Second opening 13 is the same in width from the side of the boundary between interlayer insulator film 7 and metal electrode layer 8 to the side of the semiconductor substrate. The opening width of second opening 13 perpendicular to the extending direction of trench 6 is equal to the second opening width w2 of first opening 12. Therefore, second opening 13 has a rectangular cross sectional shape.

Now the relationships between the first and second opening widths w1 and w2 of first opening 12 and the thickness t1 of interlayer insulator film 7 will be described. It is preferable to set the thickness t1 of interlayer insulator film 7 to be 0.28 times or less as large as the first opening width w1 of first opening 12 as expressed by the following formula (1). If interlayer insulator film 7 and first opening 12 of contact hole 11 are formed such that the dimensions thereof satisfy the formula (1), no void will result in metal electrode layer 8.

$$t1/w1 \leq 0.28 \tag{1}$$

As expressed by the following formula (2), the thickness t1 of interlayer insulator film 7 may be 0.6 times or more as large as the second opening width w2 of first opening 12 with no problem. When the contact hole is formed in the interlayer insulator film at a size that satisfies the following formula (2) in the conventional semiconductor device, voids are liable in metal electrode layer. In contrast, no void will result in the electrode layer 8 in the semiconductor device according to the first embodiment, even if contact hole 11 is formed in interlayer insulator film 7 at the size thereof that satisfies the following formula (2).

$$t1/w2 \geq 0.6 \tag{2}$$

By forming contact hole 11 having the above described shape and size, the bump caused in surface portion 20 of metal electrode layer 8 above contact hole 11 will not be so large as to cause a void in metal electrode layer 8, even if metal electrode layer 8 is 2 µm or more in thickness.

Figure 2:
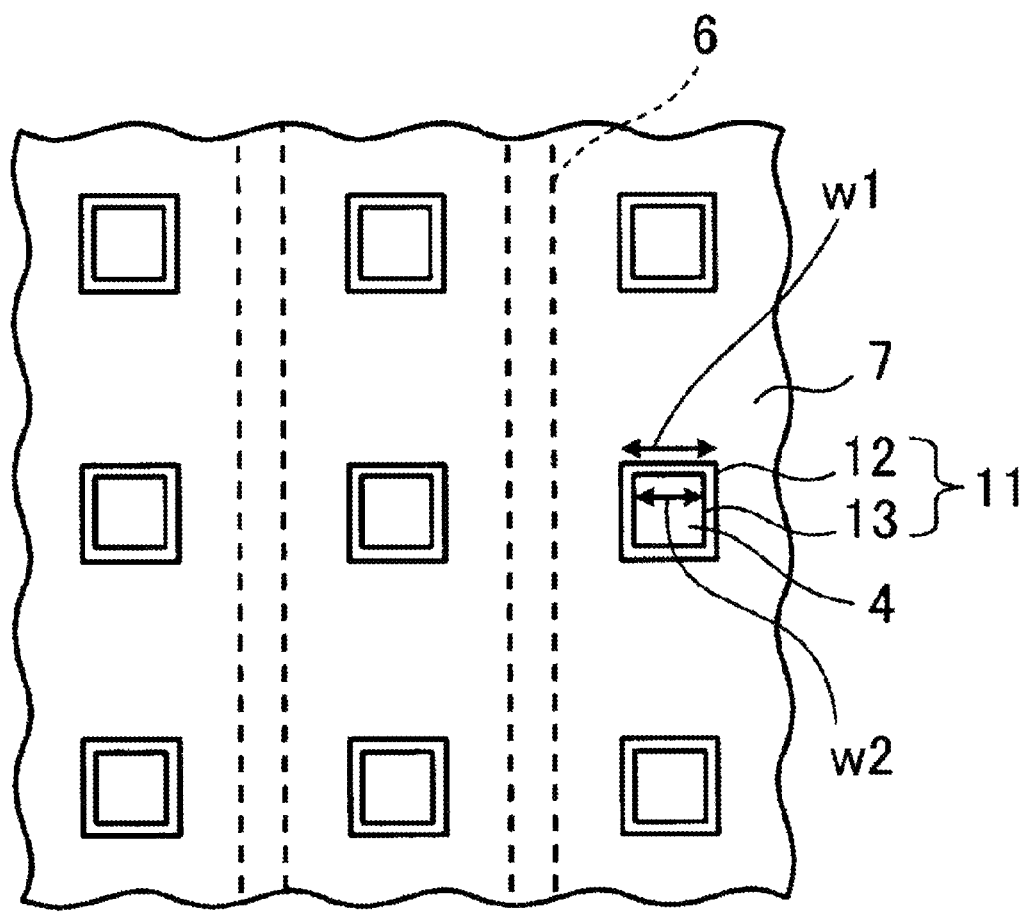
FIG. 2 is the top plan view of the semiconductor device according to the first embodiment of the invention.

Now the planar shape and the arrangement of contact hole 11 will be described below. FIG. 2 is the top plan view of the semiconductor device according to the first embodiment of the invention.

To clearly show the planar shape and arrangement of contact hole 11, only trench 6, interlayer insulator film 7, and contact hole 11 are shown in FIG. 2. (In FIG. 3, only the same constituent elements are shown). As shown in FIG. 2, contact hole 11 has a rectangular planar shape. In detail, first opening 12 and second opening 13 have rectangular planar shapes, respectively.

Contact holes 11 are arranged in a planar matrix pattern in parallel and in perpendicular to the extending direction of trenches 6. In detail, contact holes 11 are arranged like islands regularly in parallel and in perpendicular to the extending direction of trenches 6 with an equal spacing left between contact holes 11. Each contact hole 11 exposes the portion of the semiconductor substrate sandwiched by trenches 6. In detail, p-type channel region 4 including an $n^+$ source region (not shown) formed therein and a part of the $n^+$ source region formed in p-type channel region 4 are exposed to contact hole 11.

When contact holes 11 are arranged in a planar matrix pattern, rectangular trenches may be arranged in a planar matrix pattern, in place of trenches 6 extending in parallel to each other in the planar stripe pattern thereof, such that the rectangular trenches sandwich p-type channel region 4 exposed to contact hole 11 are arranged in a planar matrix pattern.

Second Embodiment

Figure 3:
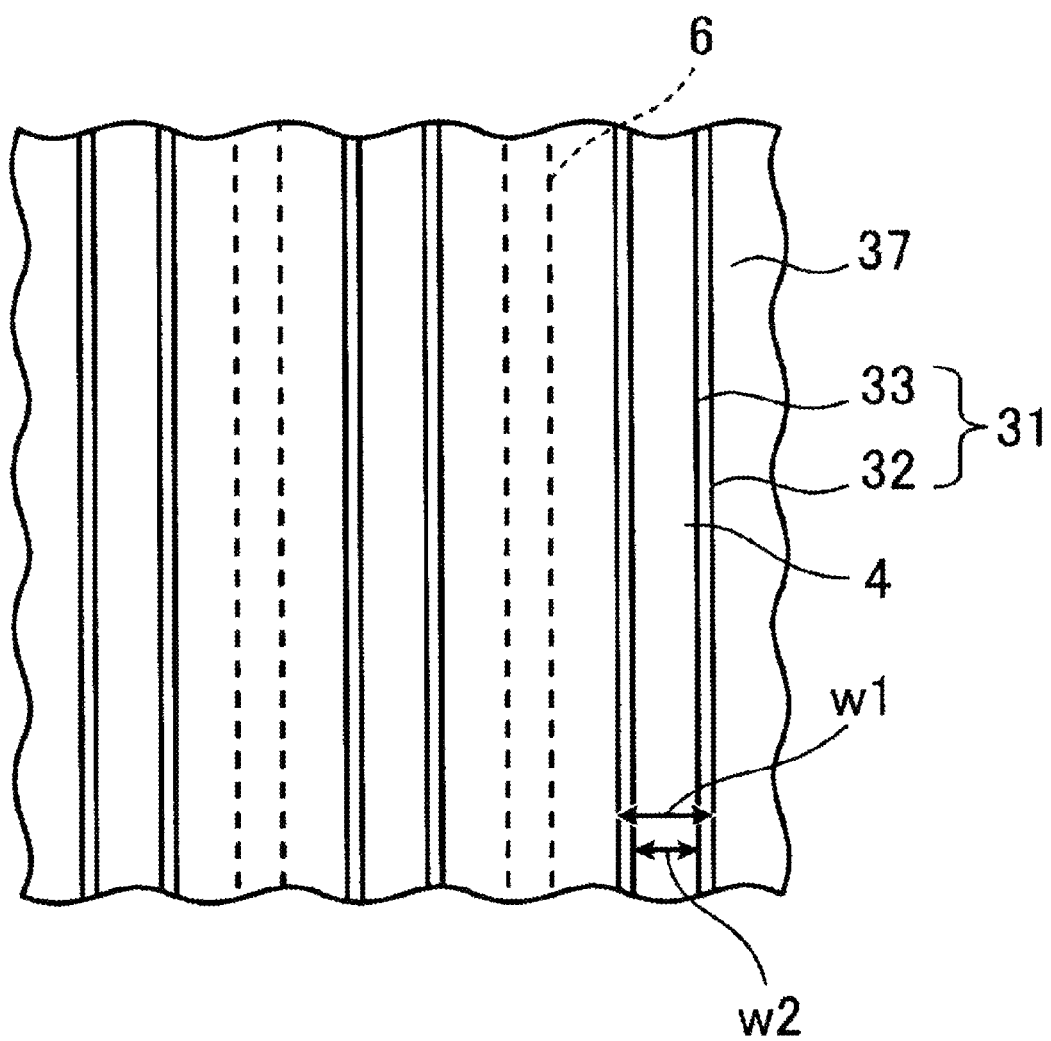
FIG. 3 is the top plan view of a semiconductor device according to a second embodiment of the invention.

FIG. 3 is the top plan view of a semiconductor device according to a second embodiment of the invention.

As shown in FIG. 3, contact holes 31 extending in parallel to the extending direction of trench 6 are formed in interlayer insulator film 37 such that contact holes 31 are arranged in a planar stripe pattern. First opening 32 and second opening 33 extend in parallel to the extending direction of trench 6. Contact hole 31 is arranged between adjacent trenches 6. The portion of p-type channel region 4 sandwiched by trenches 6 is exposed to contact hole 31. The portions of p-type channel regions 4 sandwiched by trenches 6 are exposed as the respective stripes extending in parallel to the extending direction of trenches 6.

The structure of contact hole 31 shown in FIG. 3 except the planar shape thereof is the same with the structure of contact hole 11 shown in FIG. 2. Although only the planar shape of first opening 32 is shown FIG. 3, a second opening (not shown), the width thereof perpendicular to the extending direction of trench 6 is equal to the second opening width w2 of first opening 32 perpendicular to the extending direction of trench 6, is arranged on the semiconductor substrate side of first opening 32.

Now the method for manufacturing the semiconductor device according to the first or second embodiment of the invention will be described below. FIGS. 4 through 9 are cross sectional views of the semiconductor device according to the first or second embodiment on the way of the manufacture thereof.

Figure 4:
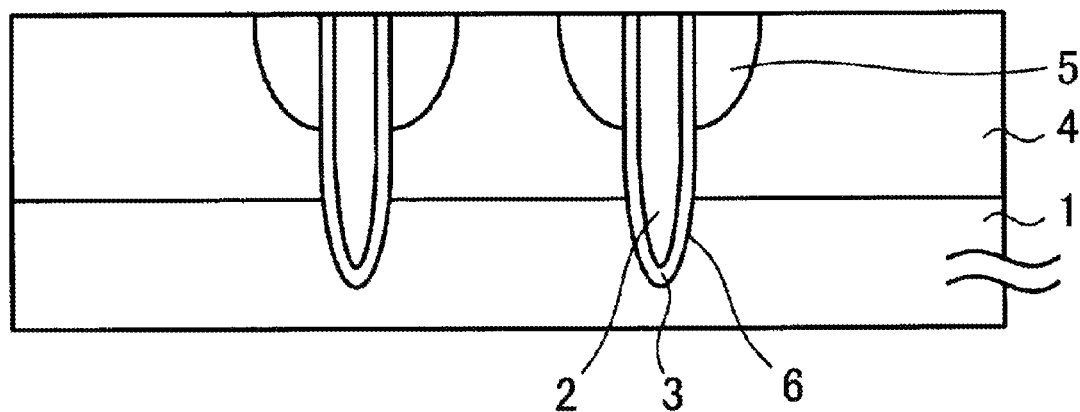
FIG. 4 is a first cross sectional view describing the cross sectional structure of the semiconductor device according to the invention on the way of manufacture thereof.

First, a front surface device structure, including gate electrode 2, gate insulator film 3, p-type channel region 4, and $n^+$ source region 5, is formed through the general manufacturing process in the front surface of the active region in a semiconductor substrate that will work as $n^-$ drift region 1 as shown in FIG. 4. Simultaneously with forming the front surface device structure of the trench IGBT in the active region, the front surface device structure (not shown) of a breakdown-withstanding structure is formed such that the breakdown-withstanding structure surrounds the active region.

After forming p-type channel region 4 in the surface portion on the front surface side of the semiconductor substrate, trench 6 is formed through p-type channel region 4 into $n^-$ drift region 1. Then, gate electrode 2 is buried in trench 6 with gate insulator film 3 interposed between gate electrode 2 and the side wall of trench 6. Then, $n^+$ source region 5 is formed in the surface portion on the front surface side of the semiconductor substrate.

Figure 5:
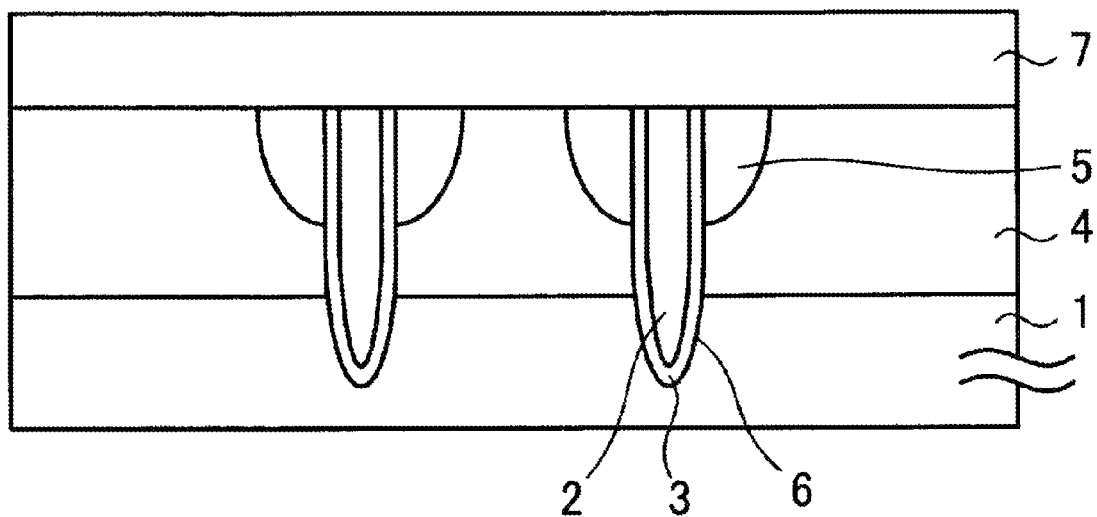
FIG. 5 is a second cross sectional view describing the cross sectional structure of the semiconductor device according to the invention on the way of manufacture thereof.
Figure 6:
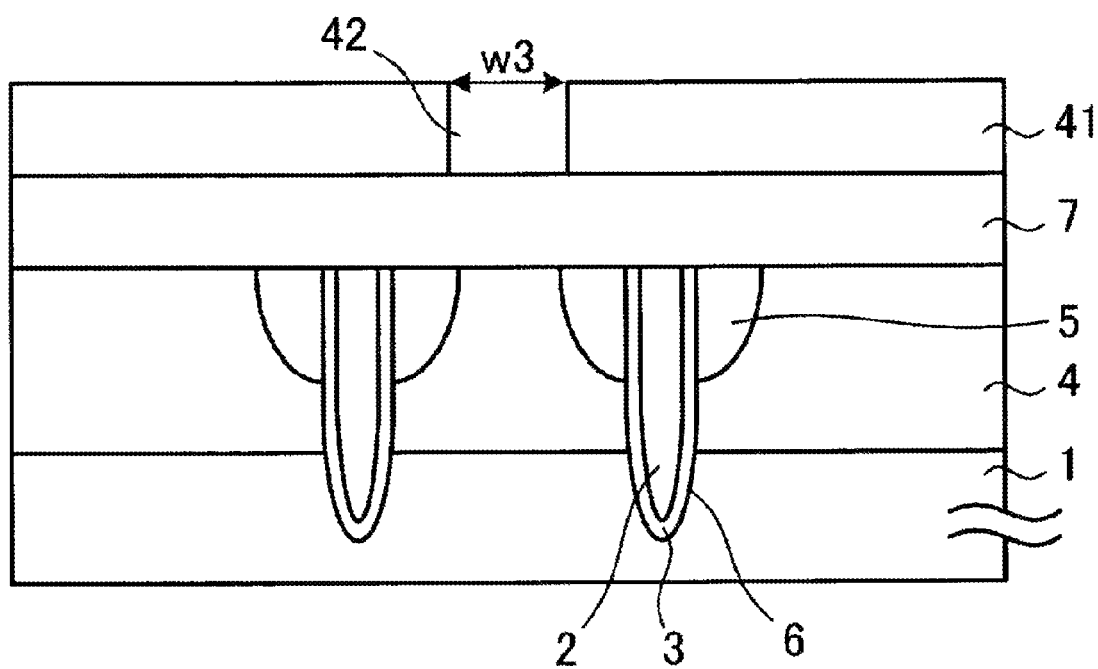
FIG. 6 is a third cross sectional view describing the cross sectional structure of the semiconductor device according to the invention on the way of manufacture thereof.

Then, interlayer insulator film 7 is formed on the front surface of the semiconductor substrate by chemical vapor deposition (hereinafter referred to as "CVD") as shown in FIG. 5. As shown in FIG. 6, resist mask 41 including opening 42, to which the intended formation region for forming contact hole 11 therein is exposed, is formed on interlayer insulator film 7. The opening width w3 of opening 42 is almost the same as the second opening width w2 of first opening 12 formed using resist mask 41 for a mask in the late step.

Opening 42 of resist mask 41 is formed such that the contact holes formed in the late step using resist mask 41 for a mask may be arranged in a planar matrix pattern or a planar stripe pattern. In detail, when contact holes 11 arranged in a planar matrix pattern are formed, openings 42 are arranged in a planar matrix pattern, in which openings 42 are arranged in parallel and in perpendicular to the extending direction of trench 6 (cf. FIG. 2).

When contact holes 31 arranged in a planar stripe pattern are formed, openings 42 are arranged in a planar stripe pattern, in which openings 42 extend in parallel to the extending direction of trench 6 (cf. FIG. 3).

Figure 7:
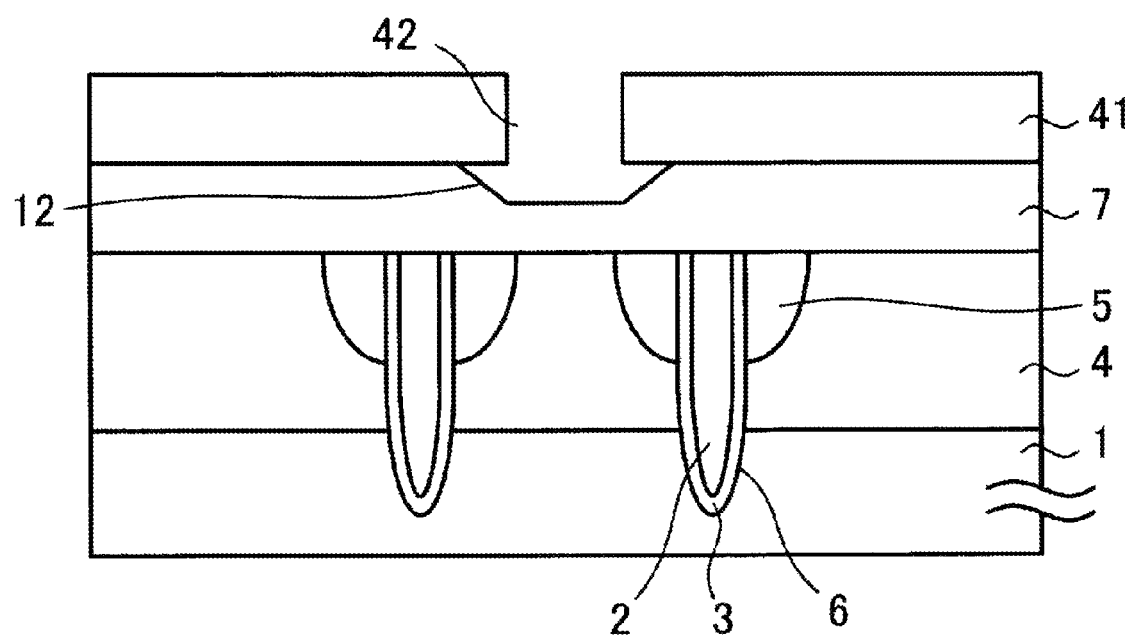
FIG. 7 is a fourth cross sectional view describing the cross sectional structure of the semiconductor device according to the invention on the way of manufacture thereof.

As shown in FIG. 7, interlayer insulator film 7 exposed to opening 42 of resist mask 41 is removed by isotropic etching using resist mask 41 for a mask. By the isotropic etching, first opening 12 shallower than the thickness of interlayer insulator film 7 is formed in the surface portion of interlayer insulator film 7. In detail, interlayer insulator film 7 is removed by isotropic etching such that the first opening 12 depth is from 50% to 60% of the interlayer insulator film 7 thickness. By making the first and second opening widths w1 and w2 satisfy the foregoing formulas (1) and (2), first opening 12 is formed at a depth between 50% and 60% of the interlayer insulator film 7 thickness.

Since interlayer insulator film 7 is removed by isotropic etching in forming first opening 12, interlayer insulator film 7 is etched in the same manner in all the directions. Therefore, the opening width (first opening width w1) of first opening 12 on resist mask 41 side is wider than the opening width of opening 42 in resist mask 41 and the opening width (second opening width w2) of first opening 12 on the semiconductor substrate side is set to be almost equal to the opening 42 width in resist mask 41. Therefore, first opening 12 has a trapezoidal cross sectional shape. A chemical dry etching (hereinafter referred to as "CDE") apparatus may be used for the isotropic etching with no problem.

Then, anisotropic etching is conducted using resist mask 41 employed in forming first opening 12 to remove interlayer insulator film 7 exposed to opening 42 in resist mask 41. The anisotropic etching for forming second opening 13 is conducted until the front surface of the semiconductor substrate is exposed. By the anisotropic etching conducted as described above, interlayer insulator film 7 exposed to first opening 12 is removed and second opening 13 connected to first opening 12 is formed.

Since interlayer insulator film 7 is removed by anisotropic etching in forming second opening 13, interlayer insulator film 7 is etched only in the depth direction thereof selectively. Therefore, second opening 13 is formed at the opening 42 width in resist mask 41, that is, the opening width is the same as the second opening width w2 of first opening 12 in the depth direction of interlayer insulator film 7. Therefore, the cross sectional shape of second opening 13 is rectangular.

Figure 8:
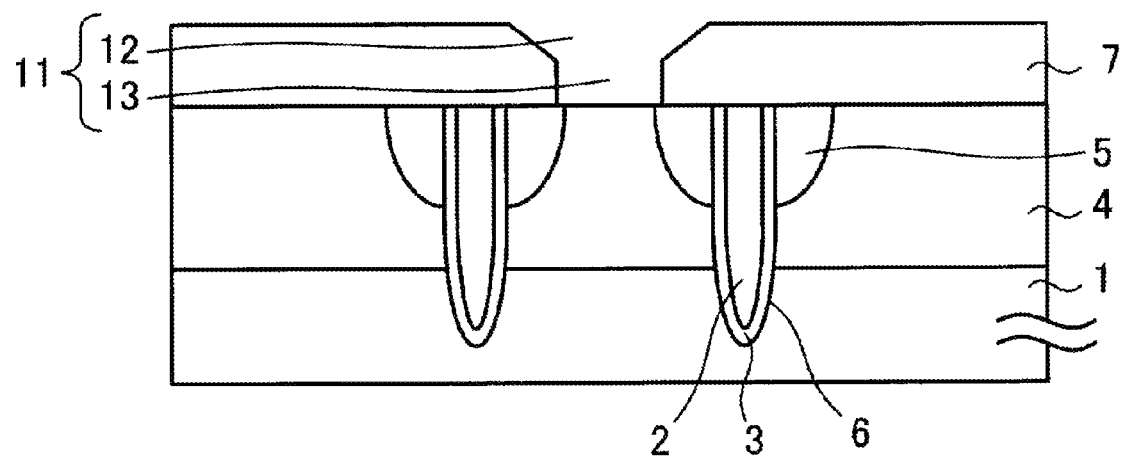
FIG. 8 is a fifth cross sectional view describing the cross sectional structure of the semiconductor device according to the invention on the way of manufacture thereof.

By conducting isotropic etching and anisotropic etching one after the other using the same resist mask 41, contact hole 11 including first opening 12 and second opening 13 is formed as shown in FIG. 8. To contact hole 11, p-type channel region 4 including $n^+$ source region 5 formed therein and a part of $n^+$ source region 5 formed in p-type channel region 4 are exposed.

Figure 9:
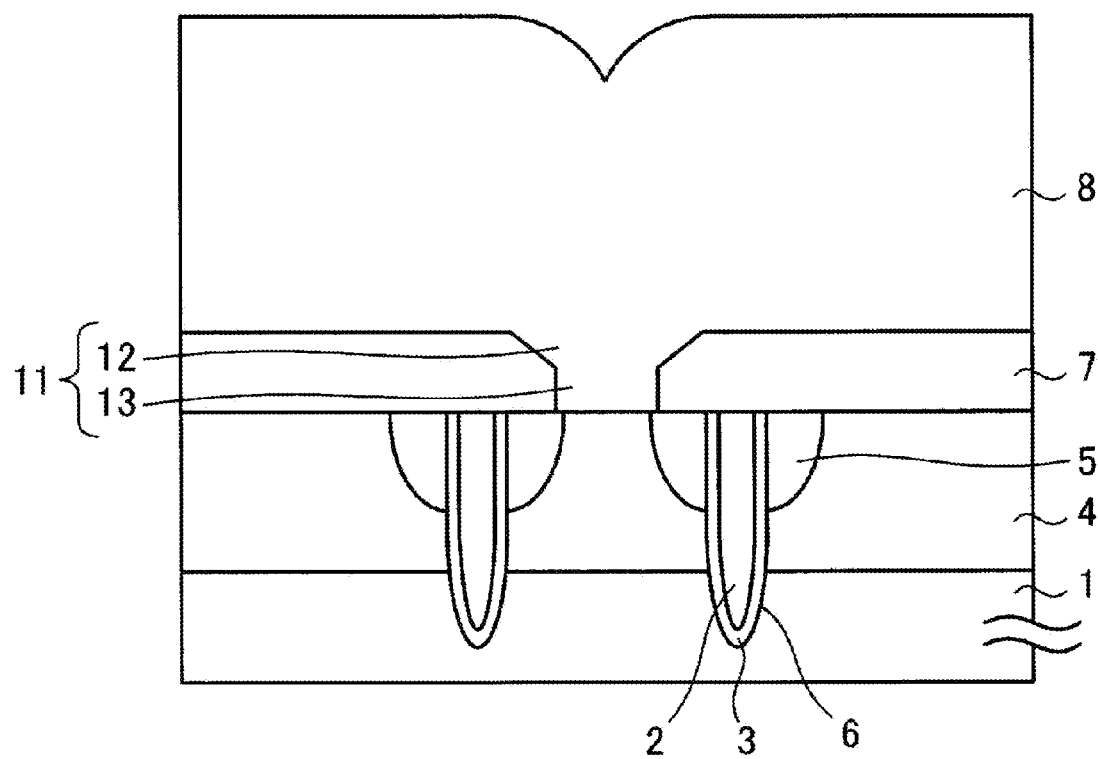
FIG. 9 is a sixth cross sectional view describing the cross sectional structure of the semiconductor device according to the invention on the way of manufacture thereof.

Resist mask 41 is removed by ashing treatment using plasma, for example. As shown in FIG. 9, metal electrode layer 8, made e.g., of aluminum, is deposited by sputtering on interlayer insulator film 7. Metal electrode layer 8 is buried in contact hole 11 and connected to p-type channel region 4 and $n^+$ source region 5 through contact hole 11.

Then, a resist mask (not shown), in which the pattern of metal electrode layer 8 is formed, is formed on metal electrode layer 8. Using the resist mask as a mask, metal electrode layer 8 exposed to the opening in the resist mask is removed to obtain the desired metal electrode layer 8 pattern. The resist mask used for patterning metal electrode layer 8 is removed by a plasma ashing treatment, for example. Then, a thermal annealing treatment is conducted to obtain a stable adhesion of metal electrode layer 8 and excellent electric characteristics.

A passivation film (not shown) is formed on the front surface of the semiconductor substrate. The passivation film is patterned by photolithography to expose metal electrode layer 8. A pretreatment and a zincate treatment are conducted for forming metal plating layer 9 on the surface of metal electrode layer 8. Metal plating layer 9, made e.g., of nickel, is formed by electroless plating on the surface of metal electrode layer 8. A collector region and a back surface electrode (not shown) are formed on the back surface of the semiconductor substrate. Thus, a vertical trench IGBT as shown in FIG. 1 is completed.

As described above, the first opening width w1 of first opening 12, that constitutes contact hole 11, on the side of the boundary between interlayer insulator film 7 and metal electrode layer 8 is formed to be wider than the second opening width w2 on the semiconductor substrate side. The angle between the side wall of first opening 12 and the front surface of the semiconductor substrate exposed to contact hole 11 is obtuse. Therefore, the step caused between interlayer insulator film 7 and the semiconductor substrate exposed to contact hole 11 curves more gently than the step caused in the conventional semiconductor device due to the side wall of first opening 12 slanting to the front surface of the semiconductor substrate at an obtuse angle.

Since the step caused between interlayer insulator film 7 and the semiconductor substrate exposed to contact hole 11 slants gently, the atoms that spring out of the target material in forming metal electrode layer 8 by sputtering stick easily to the side wall of contact hole 11. Even if the thickness t1 of interlayer insulator film 7 is 0.5 μm or more or even if metal electrode layer 8 is 2 μm or more in thickness, no void will result in metal electrode layer 8. Since no void is caused in metal electrode layer 8, no residue of the resist results on metal electrode layer 8.

As described above, by forming first opening 12 in the semiconductor device according to the invention such that the foregoing formula (1) is satisfied, the step caused between interlayer insulator film 7 and the semiconductor substrate exposed to contact hole 11 is made to slant more gently than the step caused in the conventional semiconductor device. Since the step coverage of interlayer insulator film 7 is improved as compared with the step coverage in the conventional semiconductor device, no void results in metal electrode layer 8 formed on interlayer insulator film 7. Therefore, it is possible to remove the resist mask for patterning metal electrode layer 8 without leaving any residue of the resist on metal electrode layer 8. Metal plating layer 9 is formed uniformly on metal electrode layer 8 and the reliability of the semiconductor device is improved.

Working Example

Figure 10:
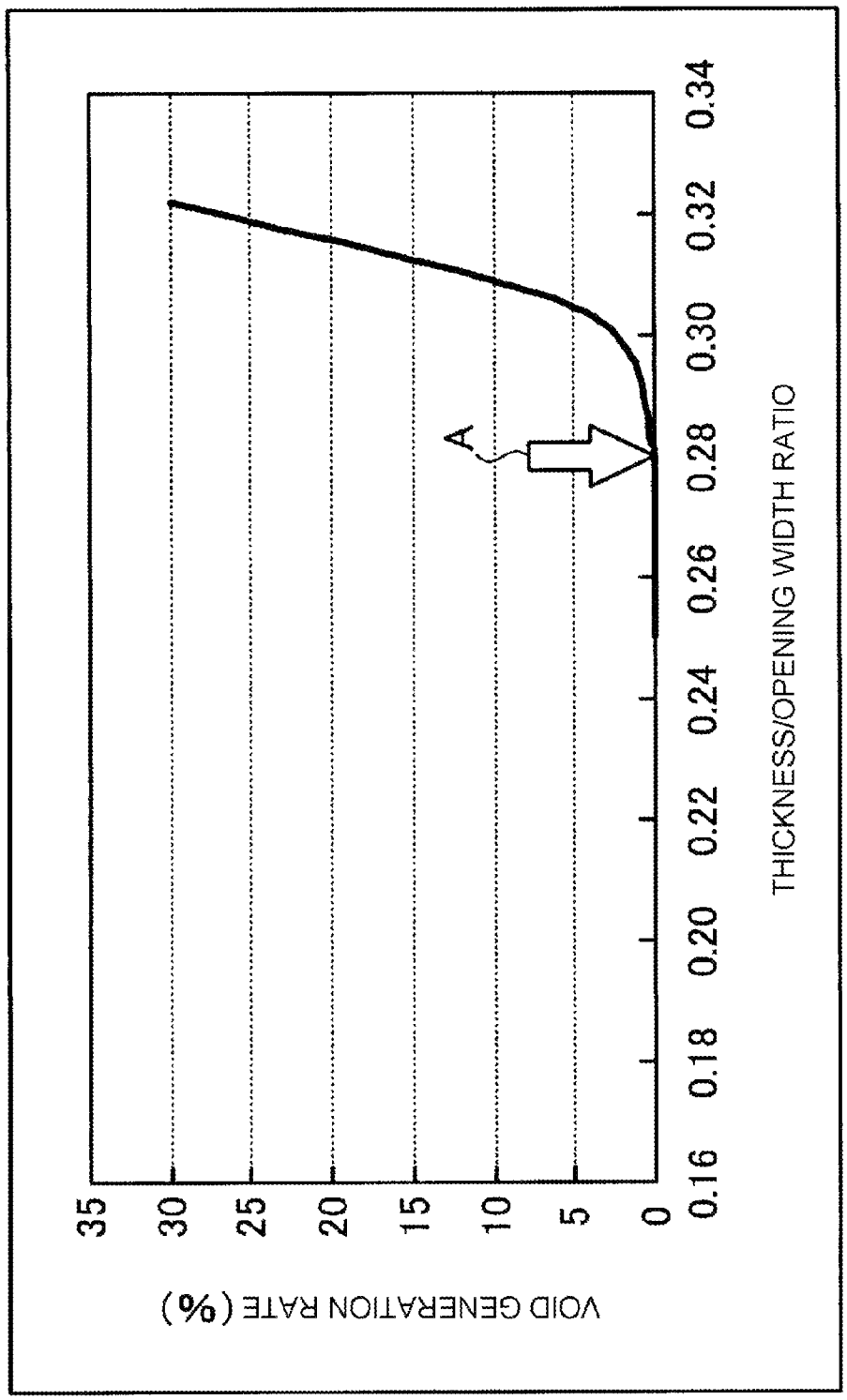
FIG. 10 is a graph describing the relation between the shape of the contact hole in the semiconductor device according to the invention and the void generation rate.
Figure 11:
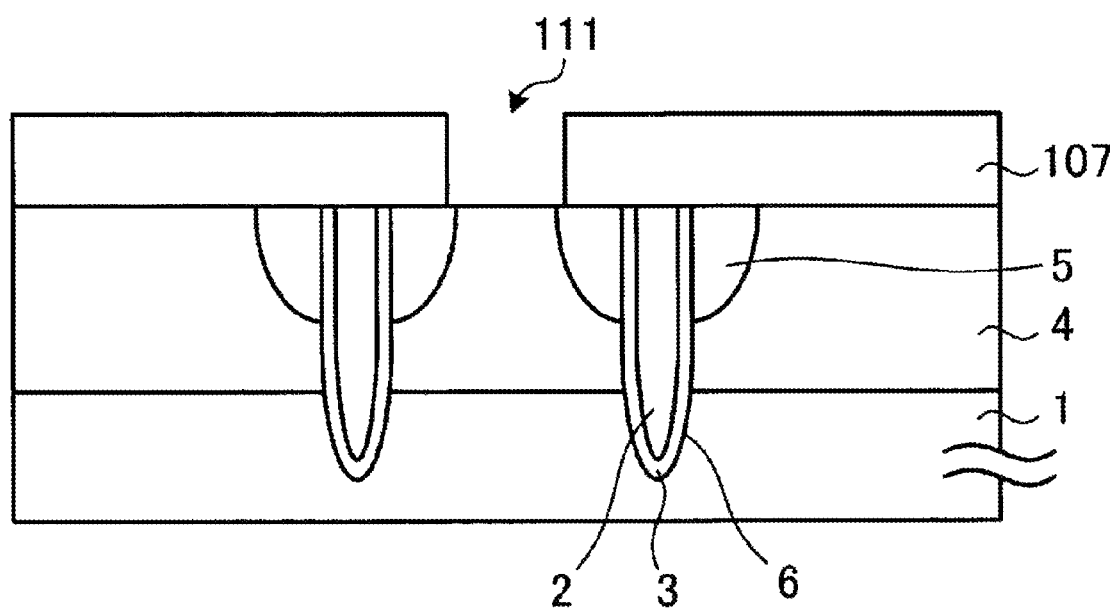
FIG. 11 is a first cross sectional view of a conventional semiconductor device on the way of manufacture thereof.
Figure 12:
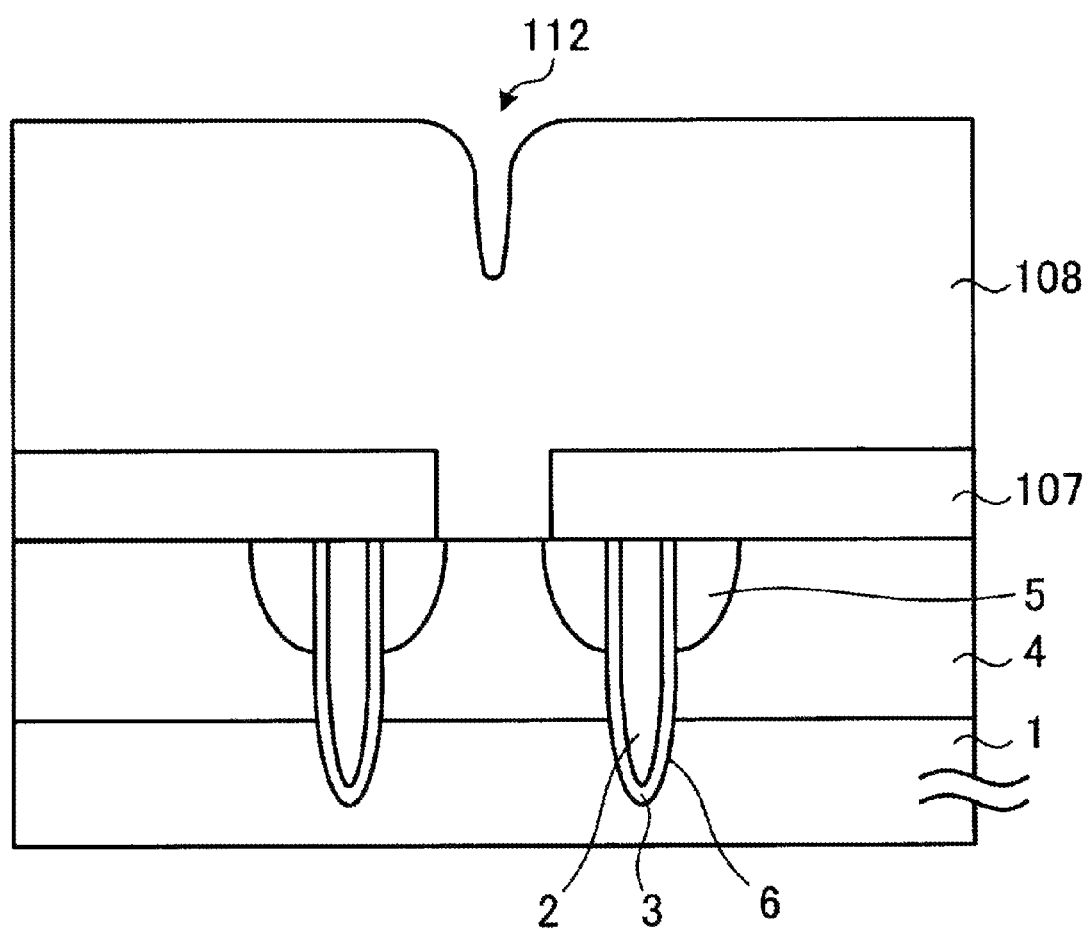
FIG. 12 is a second cross sectional view of the conventional semiconductor device on the way of manufacture thereof.
Figure 13:
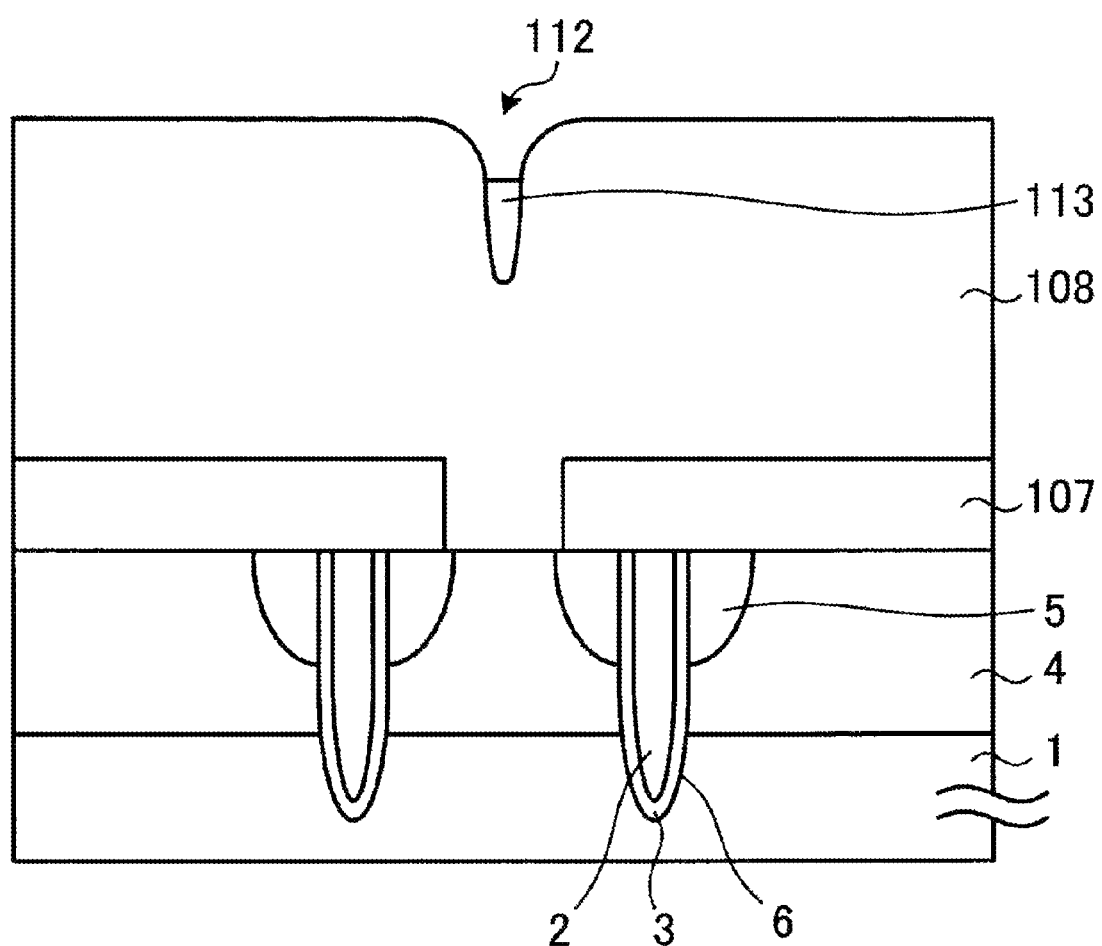
FIG. 13 is a third cross sectional view of the conventional semiconductor device on the way of manufacture thereof.
Figure 14:
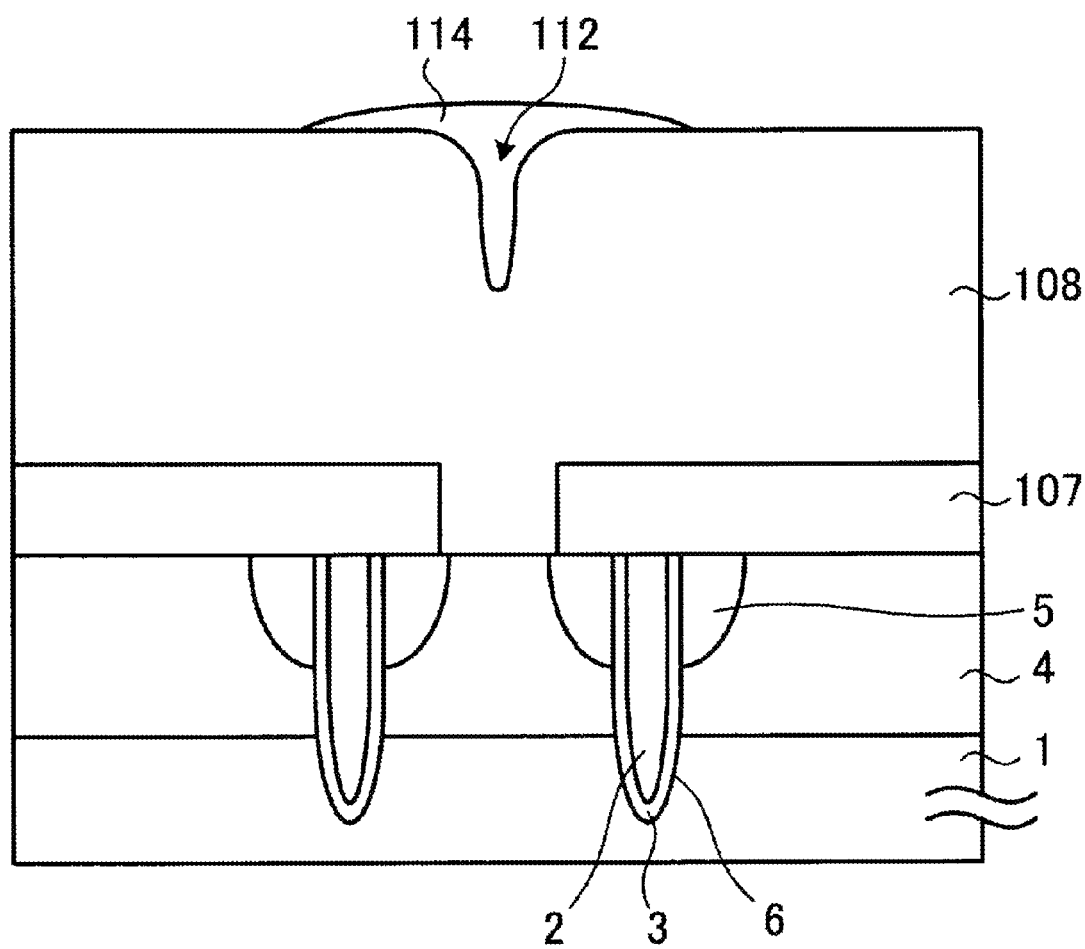
FIG. 14 is a fourth cross sectional view of the conventional semiconductor device on the way of manufacture thereof.
Figure 15:
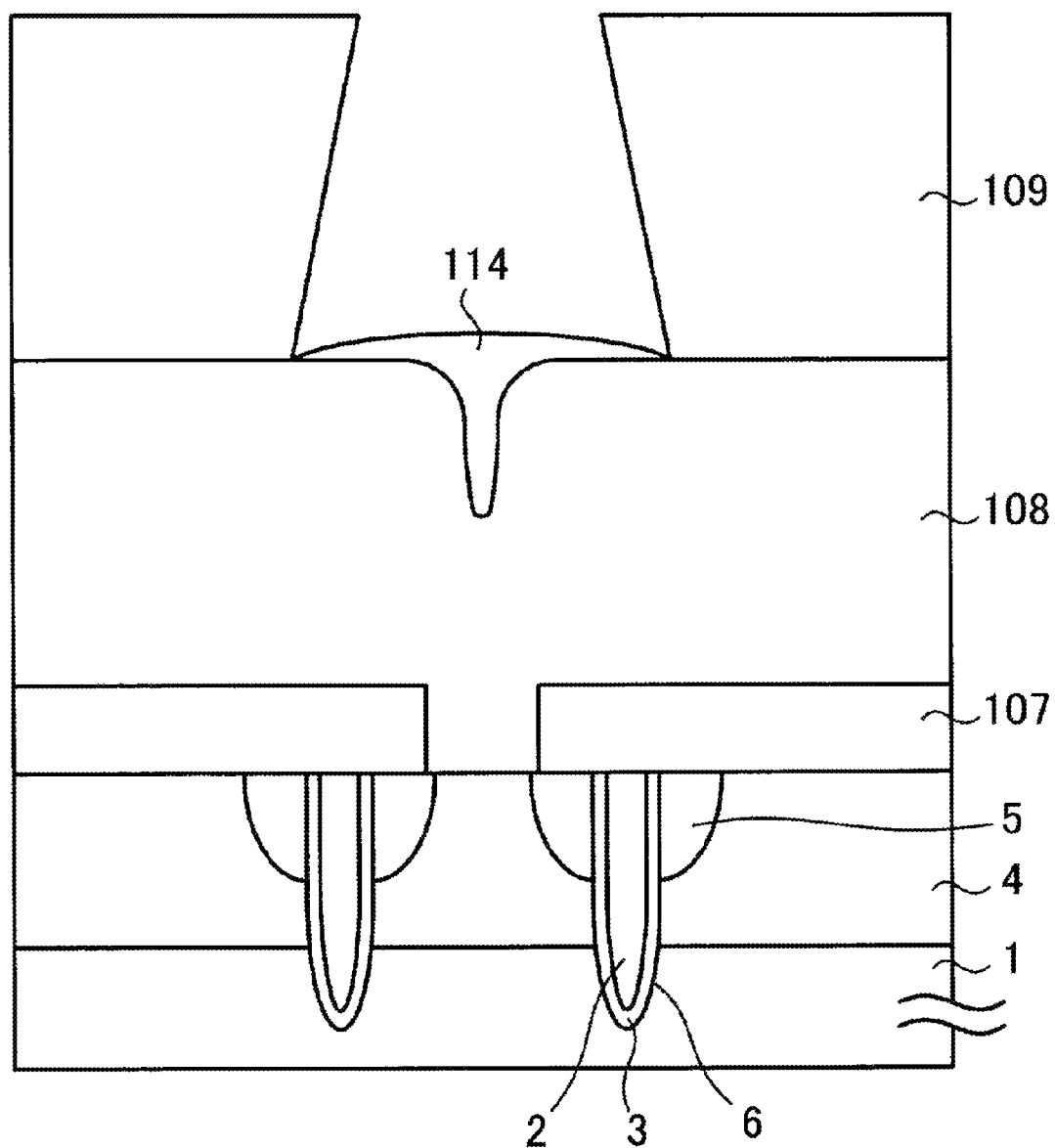
FIG. 15 is a fifth cross sectional view of the conventional semiconductor device on the way of manufacture thereof.

Now the void generation rate will be investigated below. FIG. 10 is a graph relating the void generation rate with the contact hole shape.

The semiconductor devices (hereinafter referred to as the "specimens") according to the second embodiment which include contact holes 31 arranged in a planar stripe pattern are manufactured. The first opening width w1 of the specimens is changed variously. In each specimen, the first opening width w1 of first opening 32 is set in the range in which the thickness t1 of interlayer insulator film 37 is from 0.25 times to 0.32 times as large as the first opening width w1 of first opening 32. (In other words, the thickness/opening width ratio, defined as t1/w1, is set at a value between 0.25 and 0.32).

In each specimen, second opening width w2 of first opening 32 is set at a value at which the thickness t1 of interlayer insulator film 37 is 0.6 times as large as the second opening width w2 of first opening 32. The depths of first opening 32 and the second opening are different depending on the first opening width w1 of first opening 32 formed by isotropic etching. Void generation is investigated in the specimens manufactured under the conditions described above.

The results described in FIG. 10 confirm that a void is prevented (void generation rate=0%) by setting the thickness t1 of interlayer insulator film 37 and the first opening width w1 of first opening 32 such that the thickness/opening width ratio is 0.28 or less. It is confirmed also that the first opening 32 depth of the specimen is around 60% of the thickness t1 of interlayer insulator film 37 in the specimen, in which the thickness/opening width ratio of 0.28 is measured, at the measuring point A (indicated by the outlined arrow in FIG. 10).

The semiconductor device according to the first embodiment of the invention includes contact holes 11 arranged in a planar matrix pattern. The semiconductor device according to the second embodiment includes contact holes 31 arranged in a planar stripe pattern. If the thickness t1 of interlayer insulator film 7 and the first opening width w1 of first opening 12 is set such that the thickness/opening width ratio is 0.28 or less in the semiconductor device according to the first embodiment, the semiconductor device according to the first embodiment will exhibit the same effects as the semiconductor device according to the second embodiment exhibits.

Although the invention has been described above in connection with a vertical trench IGBT, the invention is applicable to semiconductor devices having various structures including a metal electrode layer on a semiconductor substrate. Although the first conductivity type is an n-type and the second conductivity type is a p-type in the above description, the first conductivity type may be a p-type and the second conductivity type may be an n-type with no problem.

As described above, the semiconductor device according to the invention and the method for manufacturing the semiconductor device according to the invention are useful for the semiconductor device that includes a thick aluminum electrode on the front surface of a semiconductor substrate and for the manufacture thereof.

Thus, a semiconductor devices and its method of manufacturing have been described according to the present invention. Many modifications and variations may be made to the techniques and structures described and illustrated herein without departing from the spirit and scope of the invention. Accordingly, it should be understood that the devices and methods described herein are illustrative only and are not limiting upon the scope of the invention.

DESCRIPTIONS OF REFERENCE NUMERALS

1: n-type drift region
2: Gate electrode
3: Gate insulator film
4: p-type channel region
5: n$^+$ source region
6: Trench
7: Interlayer insulator film
8: Metal electrode layer
9: Metal plating layer
11 Contact hole
12: First opening
13: Second opening
20: Surface portion of the metal electrode layer above the contact hole

What is claimed is:
1. A semiconductor device comprising:
a semiconductor substrate of a first conductivity type;
a semiconductor region of second conductivity type formed on a surface of the semiconductor substrate;
a plurality of trenches formed through the semiconductor region of second conductivity type into the semiconductor substrate, the trenches extending in parallel to each other in a planar pattern;
a first electrode in the trench with a gate insulator film interposed therebetween;
an interlayer insulator film on the semiconductor region of second conductivity type;
a second electrode on the interlayer insulator film, the second electrode being connected to the second semiconductor region via a contact hole formed in the interlayer insulator film;
the contact hole being in contact with the surface of the semiconductor substrate, and comprising a first opening which is adjacent the second electrode and a second opening which is adjacent the semiconductor region of second conductivity type, the first and second openings being connected;

the first opening having, in a direction perpendicular to an extending direction of the trenches, a first opening width which is adjacent to the second electrode and a second opening width which is adjacent to the second opening, the first opening width being wider than the second opening width;

the second opening, in a direction perpendicular to the extending direction of the trenches, having a width which is equal to the second opening width of the first opening; and a thickness of the interlayer insulator film is 0.28 times or less as large as the first opening width of the first opening, wherein the thickness of the interlayer insulator film is 0.6 times or more as large as the second opening width of the first opening and the first opening depth is from 50% to 60% of the interlayer insulator film thickness.

2. The semiconductor device according to claim 1, wherein the contact hole has a rectangular planar shape, and the contact holes are arranged in parallel and perpendicular to the extending direction of the trenches.

3. The semiconductor device according to claim 2, wherein the contact holes parallel to each other in the direction perpendicular to the extending direction of the trenches are arranged along the extending direction of the trenches.

4. The semiconductor device according to claim 1, wherein the second electrode is made of a material containing aluminum as a main component thereof.

5. The semiconductor device according to claim 1, wherein the second electrode is 2 μm or more in thickness.

6. The semiconductor device according to claim 1, wherein the interlayer insulator film is 0.5 μm or more in thickness.

7. The semiconductor device according to claim 1, wherein electroless plating is performed to a surface of the second electrode.

8. A method of manufacturing a semiconductor device, the method comprising the steps of:

preparing a semiconductor substrate of a first conductivity type;

forming a region of a second conductivity type in a surface portion on a front surface side of the semiconductor substrate;

forming a trench through the semiconductor region of second conductivity type into the semiconductor substrate, the trenches extending in parallel to each other in a planar pattern;

burying a first electrode in the trench with a gate insulator film interposed therebetween;

forming an interlayer insulator film on the semiconductor region of second conductivity type;

forming a resist on the interlayer insulator film and selectively forming an opening in the resist;

conducting isotropic etching using the resist as a mask to form a first opening in the interlayer insulator film, the opening being shallower than a thickness of the interlayer insulator film; and conducting anisotropic etching using the resist to form a second opening in the interlayer insulator film, the second opening being connected to the first opening, the second opening exposing a surface of the semiconductor substrate;

wherein a thickness of the interlayer insulator film is 0.28 times or less as large as a first opening width of the first opening in a direction perpendicular to the extending direction of the trenches, and wherein the thickness of the interlayer insulator film is 0.6 times or more as large as the second opening width and the first opening depth is from 50% to 60% of the interlayer insulator film thickness.

9. The method according to claim 8, the method further comprising the steps of:

forming a second electrode on the interlayer insulator film; and connecting the second electrode to the semiconductor region of second conductivity type through the first opening and the second opening.

10. The method according to claim 8, wherein openings are formed in the resist in parallel and perpendicular to the extending direction of the trenches.

11. The method according to claim 8, wherein a stripe-shaped opening extending in parallel to the extending direction of the trench is formed in the resist.

12. The method according to claim 8, wherein the second electrode is made of a material containing aluminum as a main component thereof.

13. The method according to claim 8, wherein the second electrode is set to be 2 μm or more in thickness.

14. The method according to claim 8, wherein the interlayer insulator film is set to be 0.5 μm or more in thickness.

15. The method according to claim 8, further comprising a step of performing an electroless plating treatment to form an electroless plating layer on the second electrode.

* * * * *